(12) United States Patent
Hunt

(10) Patent No.: US 6,559,687 B1
(45) Date of Patent: May 6, 2003

(54) RAIL-TO-RAIL CMOS COMPARATOR

(75) Inventor: Ken S. Hunt, Finchampstead (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/047,285

(22) Filed: Jan. 14, 2002

(51) Int. Cl.⁷ .............................................. H03K 5/22
(52) U.S. Cl. ......................... 327/65; 327/563; 330/258
(58) Field of Search ........................... 327/65, 77, 362, 327/307, 560–563; 330/258, 253

(56) References Cited

U.S. PATENT DOCUMENTS

| | | | | |
|---|---|---|---|---|
| 5,512,848 A | * | 4/1996 | Yaklin | 327/307 |
| 5,696,457 A | * | 12/1997 | Rezzi et al. | 327/65 |
| 6,069,533 A | * | 5/2000 | Kim | 330/258 |
| 6,329,849 B1 | * | 12/2001 | Czarnul et al. | 327/103 |
| 6,429,734 B1 | * | 8/2002 | Wang et al. | 330/258 |

* cited by examiner

*Primary Examiner*—Toan Tran
(74) *Attorney, Agent, or Firm*—Fletcher, Yoder, Van Someren

(57) ABSTRACT

A full rail-to-rail CMOS comparator is provided. The comparator includes a gain stage and a bias stage. The bias stage is responsive to the common mode input voltage level to provide a bias signal that maintains the gain stage with an optimum operating range regardless of the level of the common mode input voltage, thus maintaining the comparator output responsive to the differential input voltage. Accordingly, when operating in the optimum operating range, duty cycle distortion of the signal at the comparator output is minimized. The comparator also offers improved performance due to a lower component count and fewer comparator stages, thus decreasing power consumption and improving propagation delays.

18 Claims, 3 Drawing Sheets

RAIL-TO-RAIL CMOS COMPARATOR

BACKGROUND OF THE INVENTION

1. Field of the Invention

The present invention generally relates to integrated circuits and, more particularly, to a CMOS comparator having a rail-to-rail common mode input voltage range.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Comparators are a common type of integrated circuit used in many electrical circuit applications. Many such applications often require that a comparator operate over a wide common mode input voltage range. As improvements in technology have led to lower device supply voltage:threshold voltage ratios, integrated circuit developers have found it increasingly more difficult to design and manufacture comparators that operate over a wide common mode input voltage range. Typically, as the common mode voltage at the input of the comparator approaches either the positive supply rail or the negative supply rail of the device, the comparator ceases to function properly, resulting in an output signal which is not indicative of the signals at the input of the comparator. For instance, in comparators which have a limited common mode range, the comparator output signal may collapse and/or duty cycle distortion of the output signal may result.

Although comparators which have a rail-to-rail common mode range are available, many such comparators either perform poorly and/or the manufacturing process for producing such comparators is costly due to the complexity. For example, to achieve rail-to-rail operation, a known CMOS comparator implements an n-channel differential gain stage which operates at the high end of the common mode voltage range and a p-channel differential gain stage which operates at the low end of the common mode input voltage range. The outputs of the two differential gain stages are combined in an output stage which provides the appropriate gain and level shifting to generate the comparator output signals. Although such a design may achieve operation over a full range between the positive supply rail and the negative supply rail, the operation of the design suffers from uncertain performance in the range in which the comparator is transitioning between the n-channel and p-channel differential gain stages, slow performance due to the delays introduced by the multiple cascaded stages, and high power consumption due to a large component count. Further, the response time of the comparator may vary depending on the input voltage due to the differences in response time of the n-channel differential gain stage relative to the p-channel differential gain stage.

Accordingly, it would be desirable to provide a comparator that is operational over a full rail-to-rail common mode input voltage ranges, satisfies high speed operational requirements, minimizes power consumption, and places minimal demands on the manufacturing process.

The present invention may address one or more of the problems set forth above.

BRIEF DESCRIPTION OF THE DRAWINGS

The foregoing and other advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers's specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
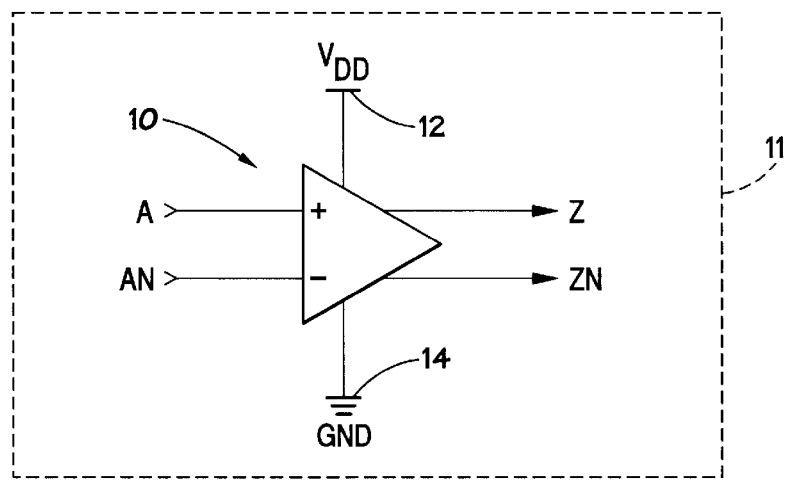
FIG. 1 is an electrical schematic symbol representative of a comparator.

Turning now to the figures and initially referring to FIG. 1, an electrical schematic symbol representative of a comparator is shown. The comparator 10 includes a positive input A, a negative input AN, an output Z, and a complementary output ZN. The positive voltage supply is labeled VDD (i.e., the positive rail 12) and the negative supply is connected to ground GND (i.e., the negative rail 14). The output signals provided at Z and ZN are responsive to the difference in the voltage between the inputs A and AN. In FIG. 1, the comparator 10 is illustrated as being disposed on a substrate 11, such as a semiconductor substrate for an integrated circuit, a printed circuit board, etc. It should be understood throughout the following description that one or more of the comparators 10 may be used in many different types of electrical circuits, such as logic circuits, control circuits, circuits for use with a memory device (e.g., an SRAM, DRAM, etc.), and so forth.

Figure 2:
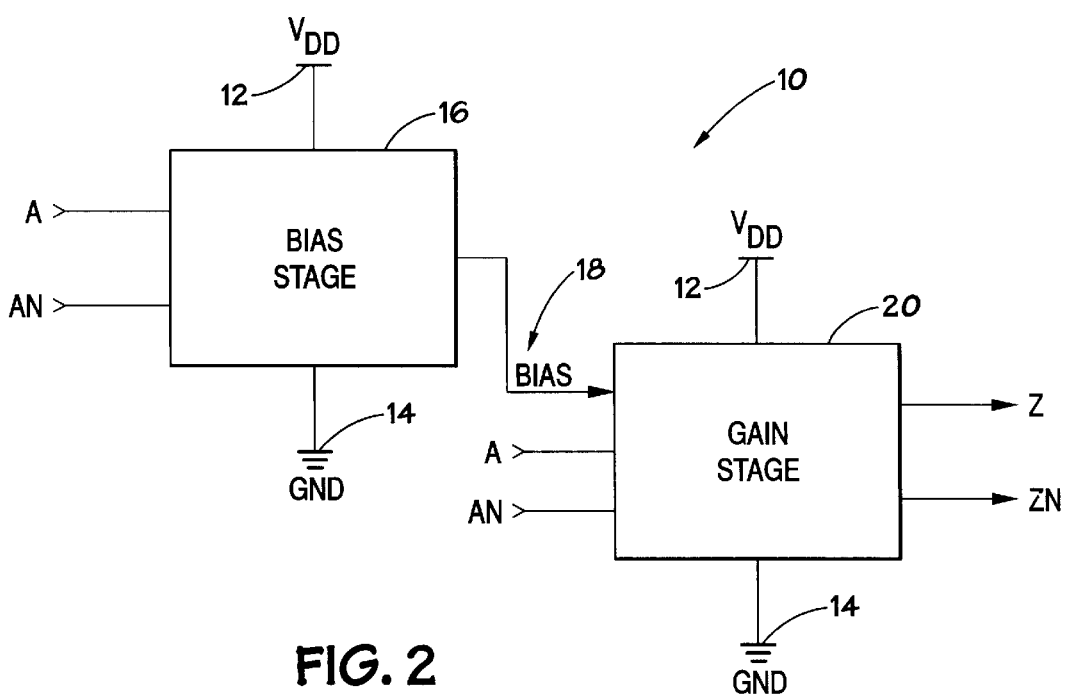
FIG. 2 illustrates an exemplary configuration of a comparator which is configured to operate over a wide common mode input range in accordance with the invention.

FIG. 2 illustrates an exemplary configuration of the comparator 10 which is configured to operate over a wide common mode input voltage range. For instance, in one embodiment, the comparator 10 can generate output signals Z and ZN which are responsive to the difference in the voltage at the inputs A and AN over a full common mode range between the positive rail 12 and the negative rail 14.

In the embodiment of the comparator 10 illustrated in FIG. 2, wide range common mode operation is achieved through the use of a bias stage 16 which provides a bias signal 18 to a differential gain stage 20 based on the common mode voltage at the inputs A and AN. In the exemplary embodiment, and as will be described in detail below, the bias signal 16 is a compensation signal that maintains the gain stage 20 within an optimal operating range even as the common mode voltage at the inputs A and AN approaches the positive rail 12 or the negative rail 14. That is, by providing the bias signal 18 to the gain stage 20, the gain stage 20 can be maintained within an active region in which the outputs Z and ZN remain responsive to the differential signal at the inputs A and AN regardless of the common mode voltage.

In an exemplary embodiment described below, the bias signal maintains the gain stage 20 within an operating range in which it can generate an output signal having a rise time that is substantially the same as the fall time over a full common mode input voltage range. Thus, distortion of the duty cycle of the output signal which might otherwise result due to the inability of the comparator 10 to drive a signal high at the same rate at which the signal is driven low over a full common mode range can be minimized. In one exemplary embodiment in which the comparator 10 is manufactured using 0.18 micron CMOS processing technology and operates at a frequency of 1 GHz, the comparator 10 can generate an output signal having rise times and fall times on the order of 200 picoseconds. In such an embodiment, the duty cycle distortion of the output signal may range from less than 1% when the common mode input voltage is about midway between the positive and negative rails to about a maximum of 5%. In other embodiments using different processing technologies and operating frequencies, the duty cycle distortion may vary over a different range, a smaller range, or even a greater range.

Figure 3:
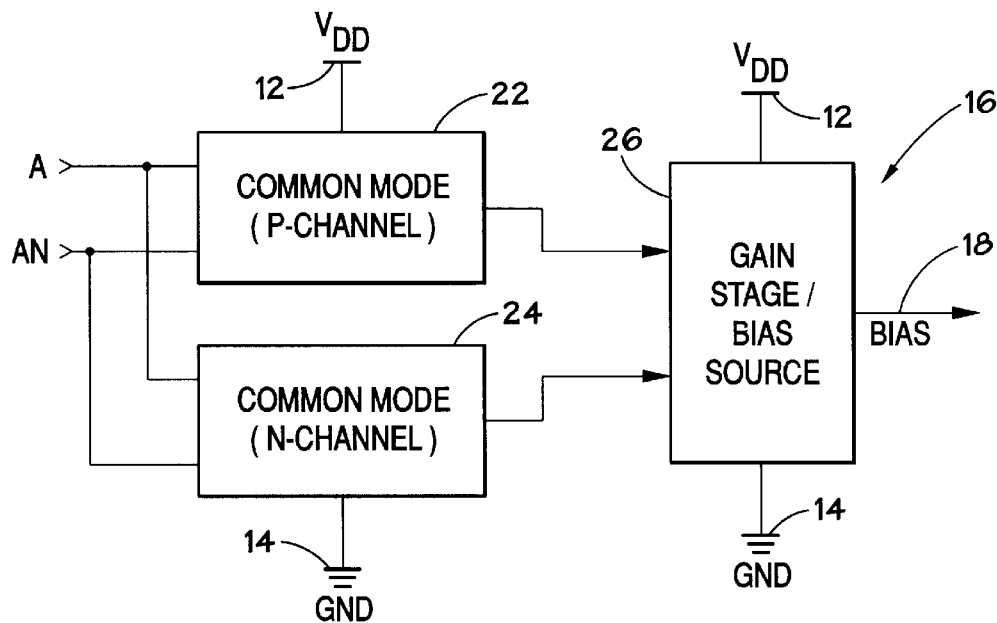
FIG. 3 illustrates a diagram representative of an exemplary embodiment of the bias stage of the comparator of FIG. 2.

Turning now to FIG. 3, a block diagram representative of the bias stage 16 of the comparator 10 is illustrated. The bias stage 16 includes a p-channel common mode stage 22 referenced to the positive rail 12 and an n-channel common mode stage 24 referenced to the negative rail 14, each of which are configured to respond to the common mode voltage on the inputs A and AN. As the common mode voltage on the inputs A and AN changes (i.e., approaches either the positive rail 12 or the negative rail 14), the p-channel common mode stage 22 and the n-channel common mode stage 24 each provides an output signal to a gain stage/bias source 26 which, in turn, generates an appropriate bias signal 18 responsive to the value of the common mode voltage. The gain stage/bias source 26 is configured to provide a suitable gain for the bias signal 18 and/or to shift the level of the bias signal 18 as appropriate for receipt by the gain stage 20 of the comparator 10.

In the exemplary embodiment of the bias stage 16 illustrated in FIG. 3, as the common mode voltage on the inputs A and AN approaches the positive rail 12, the n-channel common mode stage 24 is operative to affect the bias signal 18 generated by the gain stage/bias source 26. Similarly, as the common mode voltage approaches the negative rail 14, the p-channel common mode stage 22 is operative to affect the bias signal 18. When the common mode voltage at inputs A and AN is in a range between the positive rail 12 and the negative rail 14, both the p-channel common mode stage 22 and the n-channel common mode stage 24 are operative. For instance, in one embodiment, the n-channel stage 24 is operative when the common mode voltage ranges from 0.5V up to the positive rail 12, and the p-channel stage 22 is operative when the common mode voltage ranges between the negative rail 14 and up to 0.5V below the positive rail 12.

Figure 4:
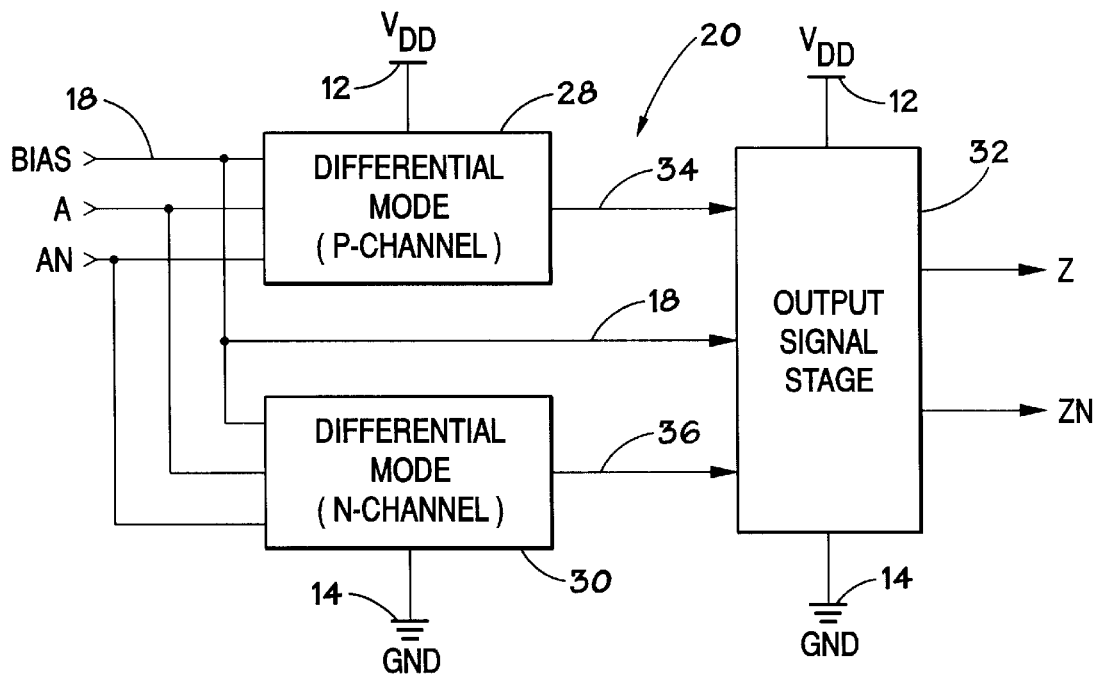
FIG. 4 illustrates a block diagram representative of an exemplary embodiment of the gain stage of the comparator of FIG. 2.

Turning now to FIG. 4, a block diagram of an exemplary embodiment of the gain stage 20 of the comparator 10 is illustrated. The gain stage 20 includes a p-channel differential mode stage 28, an n-channel differential mode stage 30, and an output signal gain stage 32. The p-channel differential stage 28 provides an output signal 34 to the output signal gain stage 32 when the common mode voltage at the inputs A and AN approaches the negative rail 14. Similarly, the n-channel differential stage 30 provides an output signal 36 to the output signal gain stage 32 when the common mode voltage at the inputs A and AN approaches the positive rail 12. In the mid-range region, both the p-channel differential stage 28 and the n-channel differential stage 30 provide output signals to the output gain stage 32.

The output signal gain stage 32 responds to the signals 34 and 36 from the p-channel differential mode stage 28 and the n-channel differential mode stage 30, respectively, to provide the output signals Z and ZN. Additionally, operation of the output signal gain stage 32 is influenced by the bias signal 18, which contributes to maintaining the output signals Z and ZN responsive to the differential between the inputs A and AN even when the common mode voltage at the inputs A and AN approaches the positive rail 12 or the negative rail 14. For instance, the bias signal 18 may maintain the gain stage 32 within an operating range in which the gain stage 32 can generate signals at the outputs Z and ZN that have substantially equal rise and fall times regardless of the common mode voltage. Accordingly, collapse of the output signals Z and ZN and/or distortion of the duty cycle of the output signals Z and ZN can be curtailed as the common mode input voltage approaches either rail.

An electrical schematic illustrating one exemplary implementation of the bias stage 16 and gain stage 20 of the comparator 10 is shown. The common mode p-channel stage 22 includes a matched pair of p-channel transistors 38 and 40 referenced to the positive rail 12 through a p-channel transistor 42. The p-channel transistors 28, 40, and 42 are configured as a current source in which the magnitude of the current at node 44 is dependent on the common mode voltage at the inputs A and AN and the bias signal 18 applied to the gate of the p-channel transistor 42. As the common mode voltage at inputs A and AN approaches the negative rail 14, more current is provided at node 44.

Similarly, the common mode n-channel stage 24 of the bias stage 16 includes a matched pair of n-channel transistors 46 and 48 referenced to the negative rail 14 through an n-channel transistor 50. The n-channel transistor 46, 48, and 50 are configured as a current source in which the magnitude of the current at node 52 is dependent on the common mode voltage at the inputs A and AN and the bias signal 18 applied to the gate of the n-channel transistor 50. As the common mode voltage at inputs A and AN approaches the positive rail 12, more current is provided at node 52.

Figure 5:
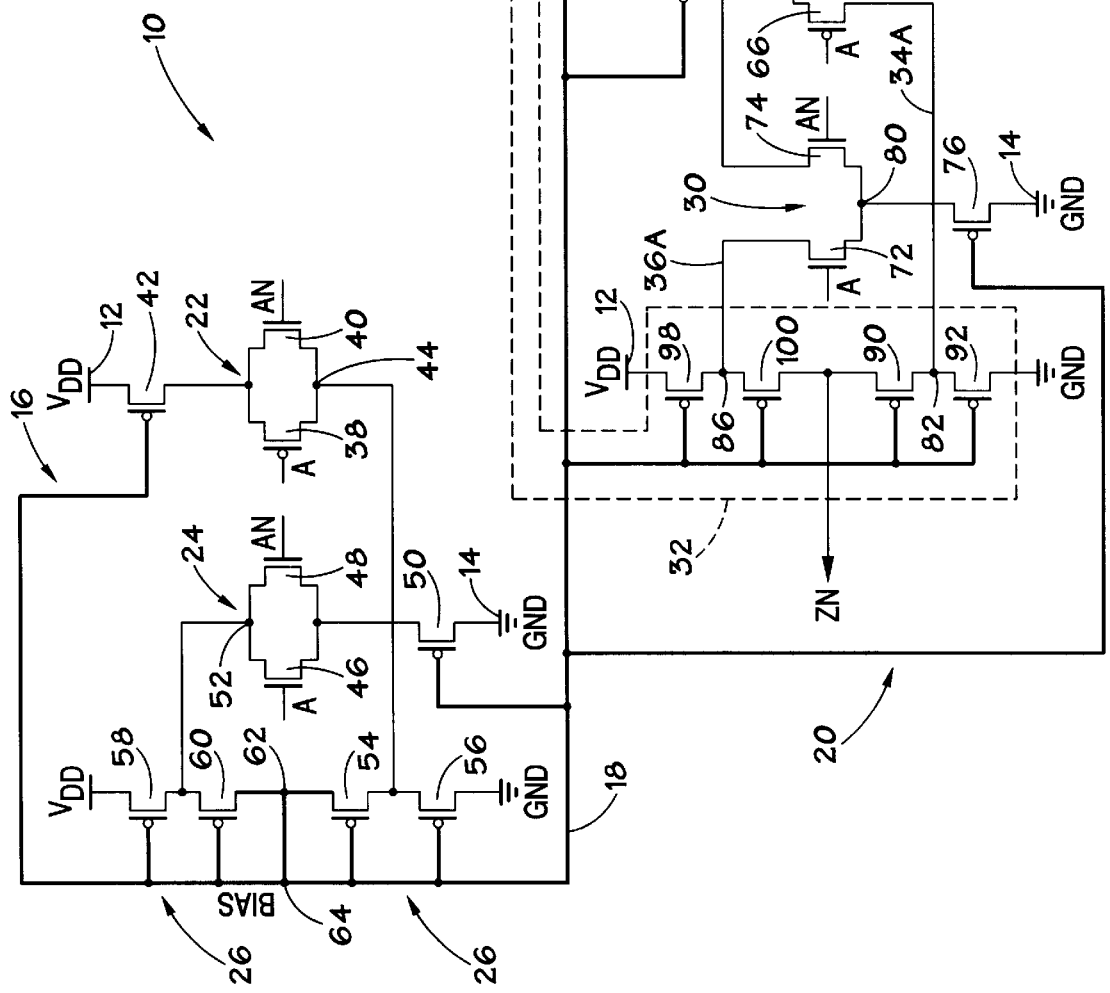
FIG. 5 illustrates an electrical schematic of an exemplary embodiment of the bias stage of FIG. 3 and the gain stage of FIG. 4

In the embodiment illustrated in FIG. 5, the bias signal 18 is fed back to the gates of the transistors 42 and 50 to stabilize the operation of the bias stage 16. Further, the current signals at nodes 44 and 52 are provided to the bias source 26, which includes a pair of n-channel transistors 54 and 56 and a pair of p-channel transistors 58 and 60 arranged as an inverter having its output (i.e., node 62) connected back to its input (i.e., node 64). The connection of the output 62 to the input 64 causes the inverter to operate at its highest gain. Further, this operating state typically generates a bias signal 18 which is about midway between the positive rail 12 and the negative rail 14.

Node 44 is connected to the node between the n-channel transistors 54 and 56. As the current at node 44 increases, the transistors 54 and 56 produce an increasing bias signal 18. This increase in the bias signal 18 causes a corresponding increase in the current through differential mode p-channel stage 28 of the gain stage 20, which, in turn, allows the output signal gain stage 32 of the comparator 10 to operate within an operating region in which it can produce output signals at Z and ZN that are responsive to the differential signals at the inputs A and AN, even though the common mode input voltage at A and AN is approaching a supply rail. That is, the output signal gain stage 32 operates in a range in which duty cycle distortion of the output signals at Z and ZN is minimized regardless of the common mode input voltage.

Similarly, the node 52 is connected to the junction of the p-channel transistors 58 and 60. As the current at node 52 increases, the transistors 58 and 60 produce an increasing bias signal 18. This increase in the bias signal 18 causes a corresponding increase in the current through differential mode n-channel stage 30 of the gain stage 20, which, in turn, allows the output signal gain stage 32 of the comparator 10 to remain within an operating region in which it can produce output signals at Z and ZN that are responsive to the differential signals at the inputs A and AN, even though the common mode input voltage at A and AN is approaching a supply rail, which, again, results in output signals having minimal duty cycle distortion.

Turning now to the gain stage 20 of the comparator 10, it includes the differential mode p-channel stage 28, the differential mode n-channel stage 30, and the output signal gain stage 32. The differential stage 28 includes a matched differential pair of p-channel transistors 66 and 68 referenced to the positive rail 12 through a p-channel transistor 70. Similarly, the differential stage 30 includes a matched differential pair of n-channel transistors 72 and 74 referenced to the negative rail 14 through an n-channel transistor 76. The p-channel transistors 66, 68, and 70 are configured as a current source in which the magnitude of the current at node 78 is dependent on the differential signal at inputs A and AN and the magnitude of the bias signal 18 applied to the gate of the transistor 70. The current at node 78 divides between the transistors 66 and 68 in a ratio that is dependent on the difference in voltage between the inputs A and AN.

Similarly, the n-channel transistors 72, 74, and 76 are configured as a current source in which the magnitude of the current at node 80 is dependent on the differential signal at inputs A and AN and the magnitude of the bias signal 18 applied to the gate of the transistor 76. The current at node 80 divides between the transistors 72 and 74 in a ratio that is dependent on the difference in voltage between the inputs A and AN.

In operation, as the common mode voltage at the inputs A and AN approaches the negative rail 14, the p-channel stage 68 is operational. Further, as described above, the bias stage 16 provides an increased bias signal 18 to the gate of the transistor 70, thus causing an increase in the current at the node 78. This increase in current corrects for the non-linear operation that may otherwise occur as the common mode voltage approaches the negative rail 14. As a result, the gain stage 20 remains within an active operating region and the output signals Z and ZN can remain responsive to the differential signal at the inputs A and AN. The output of the p-channel differential stage 28 is a differential current which is provided to the output signal stage 32 at the nodes 82 and 84.

Similarly, as the common mode voltage at the in puts A and AN approaches the positive rail 12, the n-channel stage 30 is operational. The bias stage 16 provides an increased bias signal to the gate of the transistor 76, thus causing an increase in the current at the node 80. As previously discussed, the increase in current maintains the gain stage 20 within an active operating region such that the output signals Z and ZN can remain responsive to the differential signal at the inputs A and AN as the common mode voltage approaches the positive rail 12. The output of the n-channel differential gain stage 30 is a differential current which is provided to the output signal stage 32 at the nodes 86 and 88.

The output signal stage 32 of the gain stage 20 has a dual fully symmetrical folded cascode configuration which provides the appropriate level shifting and gain to generate the outputs Z and ZN based on the differential current signals received from the differential stages 28 and 30. The differential current signal from the p-channel differential gain stage 28 is provided at nodes 82 and 84 to a negative-rail-referenced folded cascode gain stage which includes n-channel transistors 90, 92, 94, and 96. Similarly, the differential current signal from the n-channel differential gain stage 30 is provided at nodes 86 and 88 to a positive-rail-referenced folded cascode gain stage which includes the p-channel transistors 98, 100, 102, and 104. The final output Z of the comparator 10 is provided at the junction between the transistors 94 and 104. The final output ZN of the comparator 10 is provided at the junction between the transistors 90 and 100. Buffering not shown in FIG. 5 may be provided for the outputs Z and ZN depending on the operating parameters of particular application in which the comparator 10 is intended for use. For example, buffering may vary depending on the amplitude of the input voltage, the gain, and the intended load on the outputs Z and ZN.

The size of the various transistors of the comparator 10 may vary depending on the processing technology used and the voltage supply levels. In one embodiment, 0.3 um CMOS device sizes may be used with a 3V voltage supply (i.e., VDD). Further, the transistors 38/40, 46/48, 66/68, and 72/74 each are matched pairs. Still further, in one embodiment, transistors in the bias stage 16 are sized relative to transistors in the gain stage 20 such that the operating point of the bias stage 16 maintains the output signal stage 32 of the gain stage 20 at an operating point at which the duty cycle distortion at the outputs Z and ZN is minimized for all common mode input voltage levels. For instance, in one embodiment, at the operating point at which the input signals A and AN cross (regardless of the common mode level), the bias signal 18 matches the output signals Z and ZN. This matching is achieved by sizing the transistor 50 at half the size of the transistor 76, and sizing the transistor 42 at half the size of the transistor 70.

The foregoing embodiment of the circuitry of the comparator 10 is exemplary only, and it should be understood that the particular configurations of the bias stage 16 and the gain stage 20 may vary without departing from the scope of the invention. Further, it is contemplated that the comparator may be manufactured as an integrated circuit on a semiconductor substrate or may be implemented as discrete components supported by a substrate, such as a printed circuit board. Moreover, the comparator may be implemented using CMOS devices or devices manufactured using other technology.

Still further, while the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A comparator circuit, comprising:
a first input to receive a first input signal;
a second input to receive second input signal;
a gain circuit coupled to the first input and the second input, the gain circuit configured to generate an output signal responsive to the difference between the first input signal and the second input signal, the output signal having a duty cycle, wherein the gain circuit is configured as a dual fully symmetrical folded cascode circuit; and
a bias circuit coupled to the first input, the second input, and the gain circuit, the bias circuit configured to monitor a common mode voltage at the first input and the second input and to generate a bias signal correlative to the common mode voltage,
wherein, in response to the bias signal, the gain circuit maintains the output signal responsive to the difference between the first and second input signals such that distortion of the duty cycle is minimized regardless of the value of the common mode voltage.

2. The circuit as recited in claim 1, comprising a supply input to receive a supply voltage defined by a positive voltage rail and a negative voltage rail,
wherein, in response to the bias signal, the gain circuit maintains the output signal responsive to the difference between the first and second input signals when the common mode voltage is substantially the same as one of the positive voltage rail and the negative voltage rail.

3. The circuit as recited in claim 2, wherein the positive voltage rail is 3 Volts and the negative voltage rail is ground.

4. The circuit as recited in claim 1, wherein the bias circuit and the gain circuit are configured such that the value of the bias signal generated by the bias circuit matches the value of the output signal generated by the gain circuit when the value of the first input signal matches the value of the second input signal, regardless of the value of the common mode voltage at the first input and the second input.

5. The circuit as recited in claim 1, wherein, in response to the bias signal, the gain circuit maintains a rise time of the output signal substantially the same as a fall time of the output signal to minimize distortion of the duty cycle regardless of the value of the common mode voltage.

6. The circuit as recited in claim 1, wherein the comparator circuit is a CMOS comparator.

7. A comparator circuit, comprising:
a first input to receive a first input signal;
a second input to receive a second input signal;
a supply input to receive a supply voltage defined by a positive voltage rail and a negative voltage rail;
a gain circuit coupled to the supply input, the first input, and the second input, the gain circuit configured to compare the first input signal to the second input signal and to generate an output signal based on the comparison, the output signal having a rise time and a fall time, wherein the gain circuit is configured as a dual fully symmetrical folded cascode circuit; and
a bias circuit coupled to the supply input, the first input, and the second input, the bias circuit configured to monitor a common mode voltage at the first input and the second input and to generate a bias signal responsive to the value of the common mode voltage,
wherein the bias signal maintains operation of the gain circuit within a particular operating range such that the rise time of the output signal is substantially the same as the fall time of the output signal for any value of the common mode voltage between the positive rail and the negative rail.

8. The circuit as recited in claim 7, wherein the bias circuit and the gain circuit are configured such that the value of the bias signal matches the value of the output signal when the value of the first input signal matches the value of the second input signal, for any value of the common mode voltage between the positive rail and the negative rail.

9. The circuit as recited in claim 7, wherein the comparator circuit is a CMOS comparator.

10. An integrated circuit device, comprising:
a substrate; and
a comparator circuit disposed on the substrate, the comparator comprising:
a first input to receive a first input signal;
a second input to receive a second input signal;
a gain circuit coupled to the first input, and the second input, the gain circuit configured to generate an output signal based on a comparison between the first input signal and the second input signal, the output signal having a rise time and a fall time, wherein the gain circuit is configured as a dual fully symmetrical folded cascode circuit; and
a bias circuit coupled to the first input, the second input, and the gain circuit, the bias circuit configured to monitor a common mode voltage at the first input and the second input and to generate a bias signal correlative to the common mode voltage,
wherein, in response to the bias signal, the gain circuit maintains the rise time of the output signal substantially the same as the fall time of the output signal regardless of the value of the common mode voltage.

11. The integrated circuit device as recited in claim 10, wherein the comparator circuit comprises a supply input to receive a supply voltage defined by a positive voltage rail and a negative voltage rail, and wherein, in response to the bias signal, the gain circuit maintains the rise time of the output signal substantially the same as the fall time of the output signal for any value of the common mode voltage between the positive voltage rail and the negative voltage rail.

12. The integrated circuit device as recited in claim 10, wherein the comparator circuit is a CMOS comparator.

13. The integrated circuit device as recited in claim 12, wherein the substrate is a semiconductor substrate.

14. A rail-to-rail CMOS comparator, comprising:
a supply input to receive a supply voltage defined by a positive rail and a negative rail;
a first input to receive a first input signal;
a second input to receive a second input signal;
a bias stage coupled to the first input and the second input, the bias stage configured to generate a bias signal responsive to the value of a common mode voltage at the first input and the second input; and
a gain stage coupled to the supply input, the first input, the second input, and the bias stage, the gain stage configured to generate a first output signal and a second output signal, the first and second output signals being responsive to the difference between the first input signal and the second input signal,
wherein the gain stage comprises:
an n-channel differential matched pair of transistors coupled to an n-channel current control transistor, wherein the n-channel current control transistor controls the sum of the current through the n-channel differential matched pair of transistors in response to the bias signal, and wherein the difference between the current in each of the transistors of the n-channel differential matched pair corresponds to a differential current, and wherein the differential current is provided to a negative-rail-referenced folded cascoded gain stage which generates the first output signal;

a p-channel differential matched pair of transistors coupled to a p-channel current control transistor, wherein the p-channel current control transistor controls the sum of the current through the p-channel differential matched pair of transistors in response to the bias signal, and wherein the difference between the currents in each of the transistors of the p-channel differential matched pair of transistors corresponds to a differential current, and wherein the differential current is provided to a positive-rail-referenced folded cascoded gain stage which generates the second output signal, wherein the bias circuit is configured to adjust the value of the bias signal such that the first output signal and the second output signal remain responsive to the difference between the first input signal and the second input signal for any value of the common mode voltage at the first input and the second input between the positive rail and the negative rail.

15. The rail-to-rail CMOS comparator as recited in claim 14, wherein the bias circuit and the gain circuit are configured such that the value of the bias signal matches the value of the first output signal and the second output signal when the value of the first input signal matches the value of the second input signal, for any value of the common mode voltage at the first input and the second input between the positive rail and the negative rail.

16. The rail-to-rail CMOS comparator as recited in claim 14, wherein the n-channel current control transistor in the gain circuit is twice the size of the n-channel current control transistor in the bias circuit.

17. The rail-to-rail CMOS comparator as recited in claim 14, wherein the p-channel current control transistor in the gain circuit is twice the size of the p-channel current control transistor in the bias circuit.

18. The rail-to-rail CMOS comparator as recited in claim 14, wherein the first output signal has a first rise time and a first fall time, and wherein the second output has a second rise time and a second fall time, and wherein, in response to the bias signal, the first rise time is maintained substantially the same as the first fall time and the second rise time is maintained substantially the same as the second fall time regardless of the value of the common mode voltage.

* * * * *